(12) United States Patent
Ockenfuss

(10) Patent No.: US 10,170,509 B2
(45) Date of Patent: Jan. 1, 2019

(54) OPTICAL FILTER ARRAY

(71) Applicant: Viavi Solutions Inc., Milpitas, CA (US)

(72) Inventor: Georg J. Ockenfuss, Santa Rosa, CA (US)

(73) Assignee: VIAVI Solutions Inc., San Jose, CA (US)

(*) Notice: Subject to any disclaimer, the term of this patent is extended or adjusted under 35 U.S.C. 154(b) by 0 days.

(21) Appl. No.: 15/428,869

(22) Filed: Feb. 9, 2017

(65) Prior Publication Data

US 2017/0236861 A1 Aug. 17, 2017

Related U.S. Application Data

(60) Provisional application No. 62/294,999, filed on Feb. 12, 2016.

(51) Int. Cl.
| | |
|---|---|
| *H01L 31/0232* | (2014.01) |
| *H01L 27/146* | (2006.01) |
| *G01J 3/26* | (2006.01) |
| *G01J 3/28* | (2006.01) |
| *G01J 3/36* | (2006.01) |

(Continued)

(52) U.S. Cl.
CPC .......... *H01L 27/14621* (2013.01); *G01J 3/26* (2013.01); *G01J 3/2803* (2013.01); *G01J 3/36* (2013.01); *G02B 5/201* (2013.01); *G02B 5/26* (2013.01); *G02B 5/285* (2013.01); *H01L 31/02165* (2013.01); *G01J 2003/2826* (2013.01)

(58) Field of Classification Search
CPC ........ H01L 27/14621; H01L 31/02165; G02B 5/26; G02B 5/201; G02B 5/285; G01J 3/26; G01J 3/2803; G01J 3/36; G01J 2003/2826

USPC ......................................................... 257/432
See application file for complete search history.

(56) References Cited

U.S. PATENT DOCUMENTS

| 7,521,666 B2 * | 4/2009 | Tsang | ..................... G02B 5/282 |
| | | | 250/226 |
| 8,084,728 B2 * | 12/2011 | Tsang | ................ H01L 31/02162 |
| | | | 250/208.1 |

(Continued)

FOREIGN PATENT DOCUMENTS

| JP | S62267624 | 11/1987 |
| WO | WO 95/17690 | 6/1995 |
| WO | WO 2011/064403 | 6/2011 |

OTHER PUBLICATIONS

Extended European Search Report for European Application No. 17155696.2; dated Jul. 10, 2017, 9 pages.

*Primary Examiner* — Thien F Tran
(74) *Attorney, Agent, or Firm* — Harrity & Harrity, LLP

(57) ABSTRACT

A device may include a filter array disposed on a substrate. The filter array may include a first mirror disposed on the substrate. The filter array may include a plurality of spacers disposed on the first mirror. A first spacer, of the plurality of spacers, may be associated with a first thickness. A second spacer, of the plurality of spacers, may be associated with a second thickness that is different from the first thickness. A first channel corresponding to the first spacer and a second channel corresponding to the second spacer may be associated with a separation width of less than approximately 10 micrometers (μm). The filter array may include a second mirror disposed on the plurality of spacers.

20 Claims, 14 Drawing Sheets

(51) Int. Cl.
*G02B 5/20* (2006.01)
*G02B 5/28* (2006.01)
*H01L 31/0216* (2014.01)
*G02B 5/26* (2006.01)

(56) References Cited

U.S. PATENT DOCUMENTS

| | | |
|---|---|---|
| 2005/0205758 A1 | 9/2005 | Almeida |
| 2007/0076105 A1* | 4/2007 | Inokuma .................. B60R 1/00 348/273 |
| 2008/0042782 A1* | 2/2008 | Wang ........................ G02B 5/28 333/195 |
| 2008/0251873 A1* | 10/2008 | Kasano ............. H01L 27/14621 257/432 |
| 2009/0321865 A1* | 12/2009 | Kasano .................. G02B 5/201 257/432 |
| 2014/0014838 A1 | 1/2014 | Hendrix et al. |
| 2014/0168761 A1 | 6/2014 | Ockenfuss |
| 2015/0369980 A1 | 12/2015 | Ockenfuss et al. |

* cited by examiner

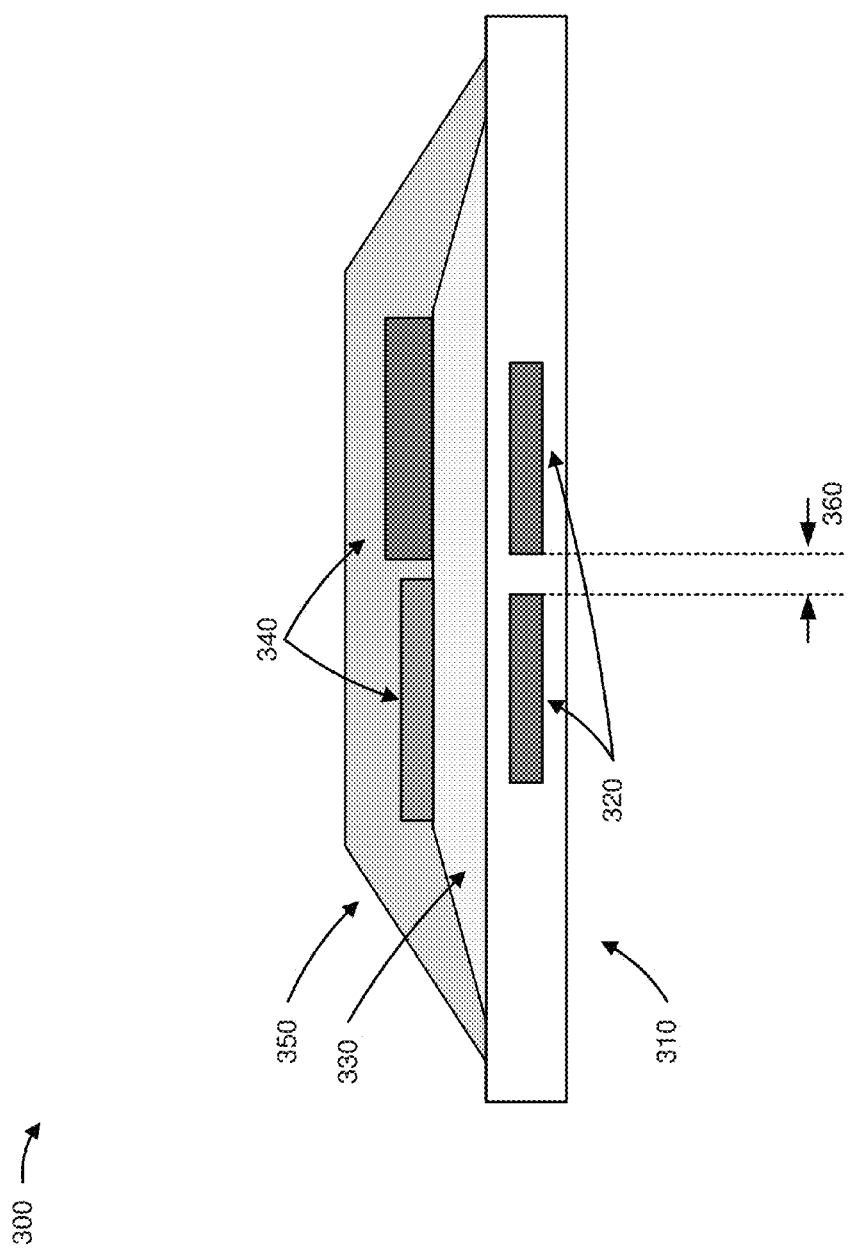

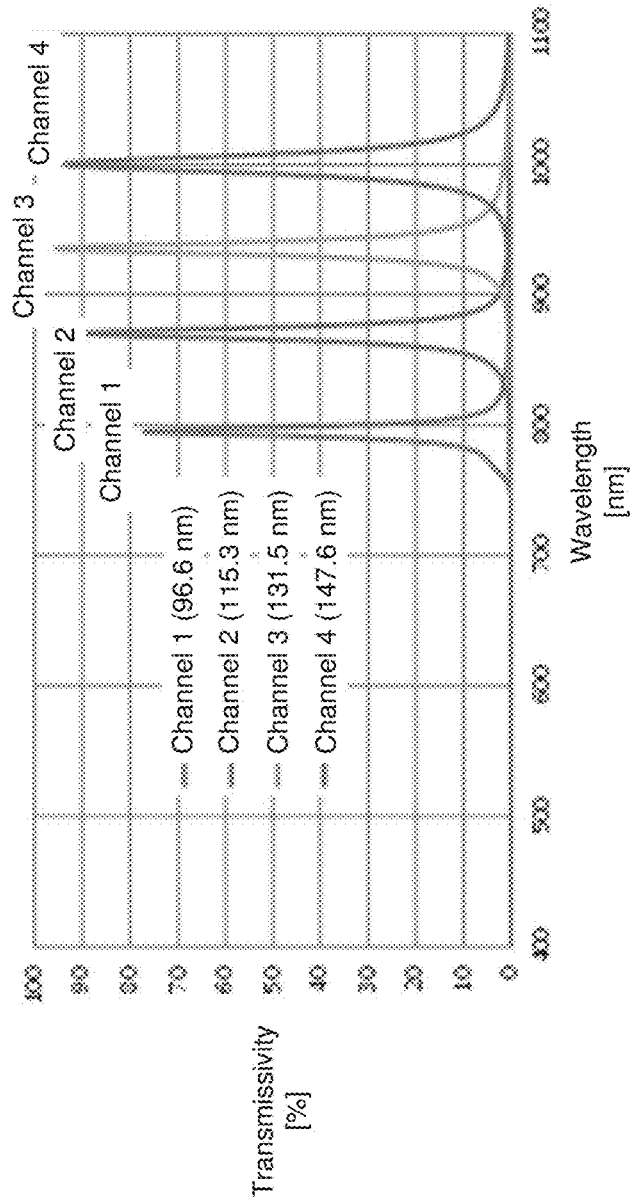

| Layer # | Material | Phys Thick (nm) | | |
|---|---|---|---|---|
| # | | | | |
| 1 | Si_H | 25.08 | blocker | |
| 2 | SiO2 | 58.62 | blocker | |
| 3 | Si_H | 40.63 | blocker | |
| 4 | SiO2 | 99.81 | blocker | |
| 5 | Si_H | 27.81 | blocker | |
| 6 | SiO2 | 77.20 | blocker | |
| 7 | Si_H | 38.65 | blocker | |
| 8 | SiO2 | 99.48 | blocker | |
| 9 | Si_H | 23.37 | blocker | |
| 10 | SiO2 | 66.94 | | QW |
| 11 | Si_H | 57.66 | mirror | QW |
| 12 | SiO2 | 148.23 | mirror | QW |
| 13 | Si_H | 57.66 | mirror | QW |
| 14 | SiO2 | 148.23 | mirror | QW |
| 15 | Si_H | 147.61 | spacer layer | |
| 16 | SiO2 | 148.23 | mirror | QW |
| 17 | Si_H | 57.66 | mirror | QW |
| 18 | SiO2 | 148.23 | mirror | QW |
| 19 | Si_H | 57.66 | mirror | QW |
| 20 | SiO2 | 148.23 | mirror | QW |

| G | IR/B | G | IR/B | G | IR/B | G | IR/B |
|---|---|---|---|---|---|---|---|
| R | B | R | B | R | B | R | B |
| G | IR/B | G | IR/B | G | IR/B | G | IR/B |
| R | B | R | B | R | B | R | B |
| G | IR/B | G | IR/B | G | IR/B | G | IR/B |
| R | B | R | B | R | B | R | B |
| G | IR/B | G | IR/B | G | IR/B | G | IR/B |
| R | B | R | B | R | B | R | B |

OPTICAL FILTER ARRAY

RELATED APPLICATION(S)

This application claims priority under 35 U.S.C. § 119 to U.S. Provisional Patent Application No. 62/294,999, filed on Feb. 12, 2016, the content of which is incorporated by reference herein in its entirety.

BACKGROUND

In an optical device, such as a sensor element array, sensor elements may be associated with a particular spacing. For example, a first sensor element may be associated with a particular spacing from a second sensor element. The sensor elements may be associated with a size of between approximately 50 micrometers (µm) and 200 µm. The spacing between a pair of sensor elements may be greater than approximately 20 µm. A sensor element array may be used for a sensing system, such as a three-dimensional depth sensing system or the like.

SUMMARY

According to some possible implementations, a device may include a filter array disposed on a substrate. The filter array may include a first mirror disposed on the substrate. The filter array may include a plurality of spacers disposed on the first mirror. A first spacer, of the plurality of spacers, may be associated with a first thickness. A second spacer, of the plurality of spacers, may be associated with a second thickness that is different from the first thickness. A first channel corresponding to the first spacer and a second channel corresponding to the second spacer may be associated with a separation width of less than approximately 10 micrometers (µm). The filter array may include a second mirror disposed on the plurality of spacers.

According to some possible implementations, a device may include a filter array disposed on a substrate. The filter array may include a first mirror disposed on the substrate. The filter array may include a spacer disposed on the first mirror. The spacer may include a plurality of spacer layers. A first spacer layer, of the plurality of spacer layers, may be disposed to cover the first mirror. A second spacer layer, of the plurality of spacer layers, may be disposed onto the first spacer layer. A first channel corresponding to the first spacer layer and a second channel corresponding to the second spacer layer may be associated with a separation width of less than approximately 5 micrometers (µm). The filter array may include a second mirror disposed on the spacer.

According to some possible implementations, a device may include a filter array disposed on a substrate. The substrate may be a glass substrate to be bonded to a sensor element array or a silicon substrate including the sensor element array. The filter array may include a first mirror disposed on the substrate. The filter array may include a plurality of spacer layers. A first spacer layer, of the plurality of spacer layers, may be disposed onto the first mirror and covering a set of sensor elements of the sensor element array. A second spacer layer, of the plurality of spacer layers, may be disposed onto the first spacer layer and covering a subset of the set of sensor elements. A third spacer layer, of the plurality of spacer layers, may be disposed onto the second spacer layer and covering a subset of the subset of sensor elements. Each sensor element, of the set of sensor elements, may be associated with a spacing of less than approximately 1 micrometer (µm). The filter array may include a second mirror disposed on the plurality of spacer layers. The second mirror may be aligned with the set of sensor elements.

BRIEF DESCRIPTION OF THE DRAWINGS

FIG. 3 is a diagram of an overview of an example implementation, as described herein;

FIGS. 4A-4E are diagrams of an example implementation an optical filter coating, as described herein; and FIGS. 5A-5E are diagrams of an example implementation of an optical filter coating for a depth sensing system, as described herein.

DETAILED DESCRIPTION

The following detailed description of example implementations refers to the accompanying drawings. The same reference numbers in different drawings may identify the same or similar elements.

In an optical device, such as a sensor element array, sensor elements may be spaced by a particular distance. The sensor elements may be associated with a size of between approximately 50 micrometers (µm) and 200 µm. Spacing between a pair of sensor elements may be greater than approximately 20 µm. However, as quantities of sensor elements included in a single optical device increase and/or as package sizes for optical devices decrease, it may be advantageous to manufacture sensor element arrays of sensor elements with a spacing of less than approximately 20 µm, less than approximately 10 µm, less than approximately 1 µm, or the like. Implementations, described herein, may provide an optical filter to enable a sensor element array of sensor elements with a spacing of less than a threshold value, such as less than approximately 20 µm, less than approximately 10 µm, less than approximately 1 µm, or the like.

Figure 1A:
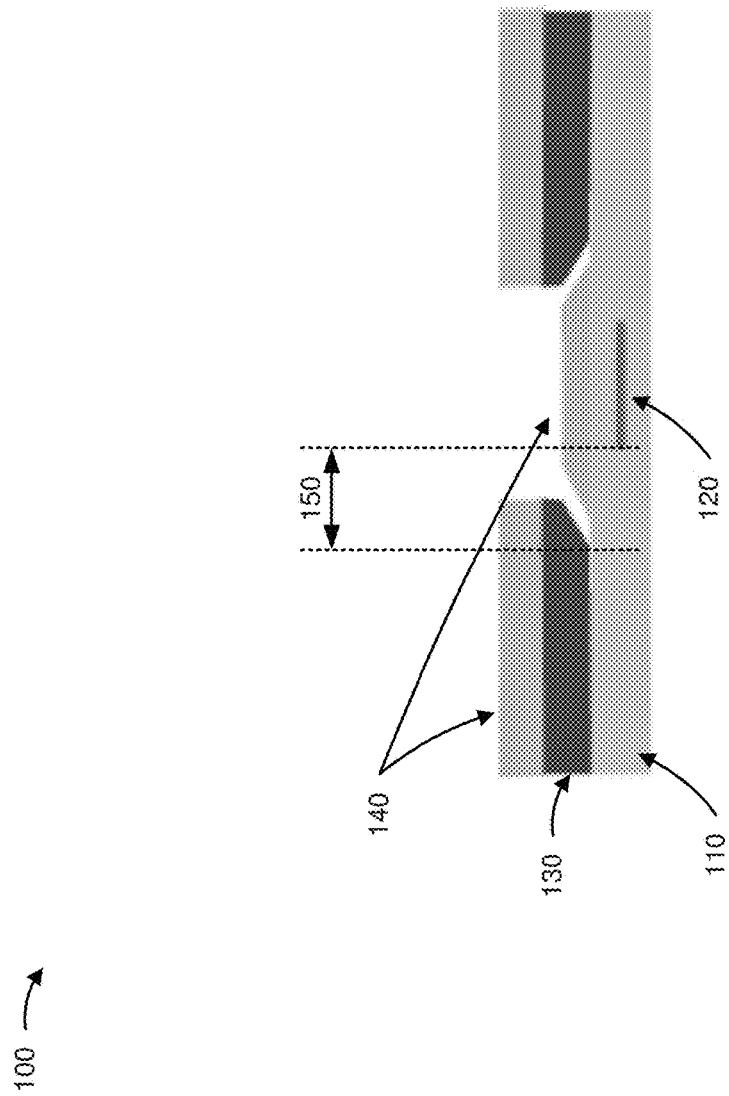
FIGS. 1A and 1B are diagrams of an example of a dielectric based optical filter coating, as described herein.
Figure 1B:
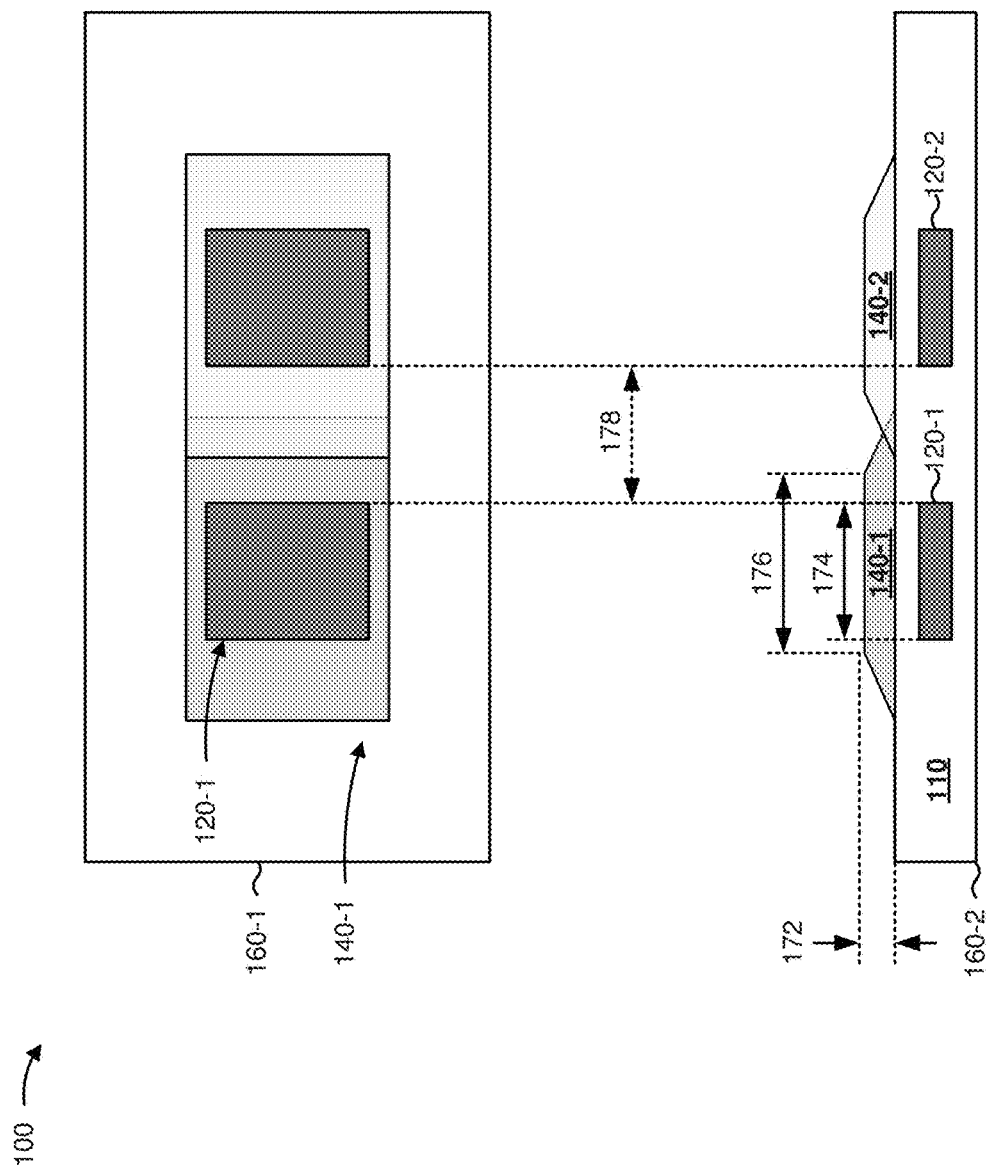

FIGS. 1A and 1B are diagrams of an example 100 of a dielectric based optical filter coating, as described herein. As shown in FIG. 1A, example 100 includes a substrate 110, a photodiode 120, a photoresist layer 130, a filter coating layer 140, and a transition area 150.

With regard to FIG. 1A, the dielectric based optical filter coating is manufactured on substrate 110, which may be an active device wafer, using a lift-off process. The lift-off process may be selected based on a difficulty in chemical etching, physical etching, or the like. Photoresist layer 130 is disposed onto regions of substrate 110 where filter coating layer 140 is not to be deposited. For example, based on filter coating layer 140 being intended to be deposited to cover photodiode 120 or another type of sensor element, photoresist layer 130 is disposed on portions of substrate 110 that are not aligned to photodiode 120. After deposition of filter coating layer 140 onto photoresist layer 130 and an exposed portion of substrate 110 that is aligned with photodiode 120, a lift-off process is performed to remove photoresist layer 130, resulting in filter coating layer 140 remaining at the portion of substrate 110 aligned to photodiode 120. However, the lift-off process results in transition area 150 where filter coating layer 140 is associated with a tapered edge of reducing physical thickness. Transition area 150 may be associated with a width of between approximately two and three times a thickness of filter coating layer 140.

As shown in FIG. 1B, in a top-view 160-1 and a side-view 160-2, a set of photodiodes 120-1 and 120-2 may be positioned in substrate 110, and may be covered by a set of filter coating layers 140-1 and 140-2 such that filter coating layer 140-1 overlaps with filter coating layer 140-2. Overlapping filter coating layers 140 reduces a spacing between photodiode 120-1 and photodiode 120-2 relative to separating filter coating layers 140. In this case, filter coating layers 140 are associated with a thickness 172, a photodiode area 174 (e.g., an area that is aligned with a corresponding photodiode 120, and a functional area 176 (e.g., an area that is disposed between tapered edges of the particular filter coating layer 140). Photodiodes 120 may be associated with a separation width 178 (e.g., a spacing between photodiodes 120). Separation width 178 may be greater than three times thickness 172. In this case, thickness 172 is greater than approximately 5 micrometers (μm) resulting in separation width 178 being great than approximately 15 μm. However, it may be advantageous to achieve separation widths between photodiodes of less than 15 μm, less than 10 μm, less than 5 μm, less than 1 μm, or the like.

As indicated above, FIGS. 1A and 1B are provided merely as an example. Other examples are possible and may differ from what was described with regard to FIGS. 1A and 1B.

Figure 2:
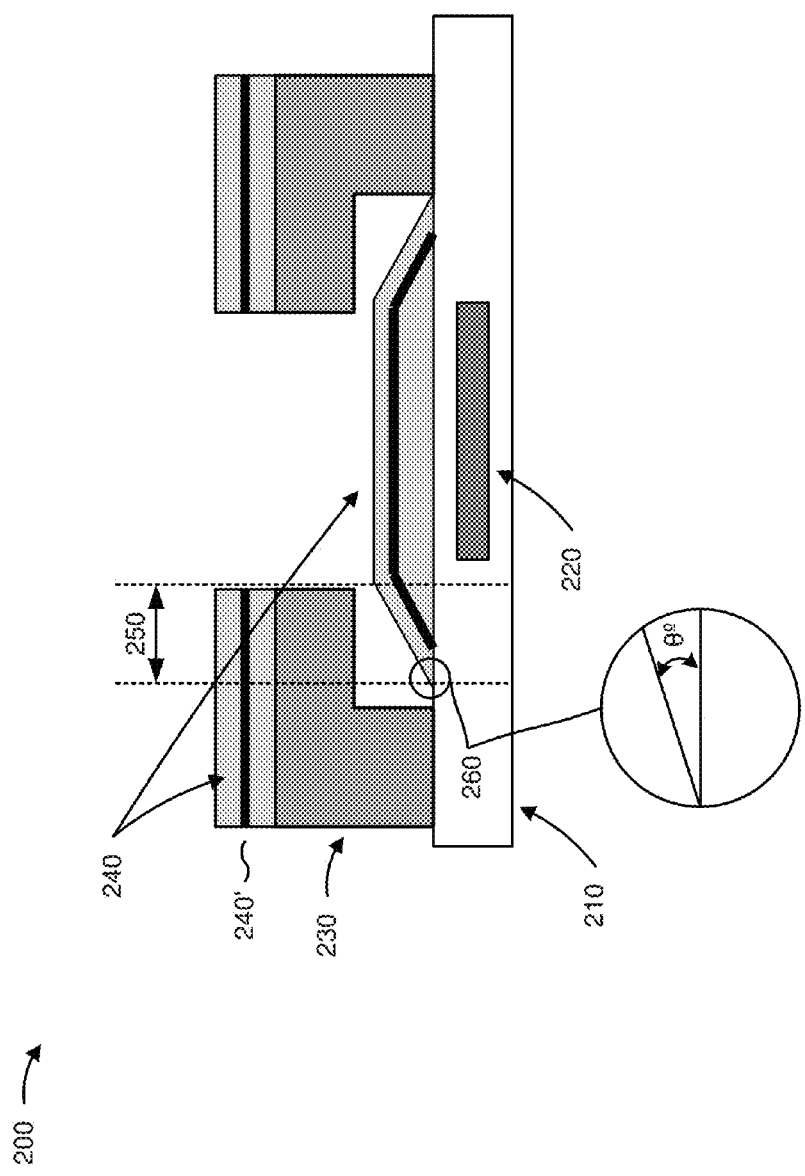
FIG. 2 is a diagram of an example of an induced transmission filter (ITF) based optical filter coating, as described herein.

FIG. 2 is a diagram of an example 200 of an induced transmission filter (ITF) based optical filter coating, as described herein. As shown in FIG. 2, example 200 includes a substrate 210, a photodiode 220, a photoresist layer 230, a filter coating layer 240, which includes a metal layer 240', and a transition area 250.

With regard to FIG. 2, metal layer 240' may include a silver (Ag) layer, an aluminum (Al) layer, or the like. Metal layer 240' may be encapsulated by a dielectric portion of filter coating layer 240 that reduces a likelihood of corrosion relative to exposing metal layer 240'. In this case, to manufacture filter coating layer 240 to provide protective encapsulation, the tapered edge of filter coating layer 240 is manufactured to have less than a threshold internal angle 260, such as less than approximately 5 degrees. The ITF based optical filter coating may be less than approximately 1000 nanometers (nm) in thickness, such as approximately 500 nm, but based on threshold internal angle 260 being less than approximately 5 degrees, transition area 250 may be approximately 10 μm to 20 μm, which may correspond to a spacing between photodiodes 220 of between approximately 10 μm to 20 μm. This may be larger than is advantageous for sensor element arrays that are to include sensor elements, such as photodiodes 220, that are sized between approximately 2 μm and 50 μm and are to be associated with a spacing of between approximately 0.5 μm and 10 μm.

As indicated above, FIG. 2 is provided merely as an example. Other examples are possible and may differ from what was described with regard to FIG. 2.

FIG. 3 is a diagram of an overview of an example implementation 300. Example implementation 300 illustrates a single cavity Fabry-Perot filter based optical filter coating, as described herein, that is associated with a spacing of less than a threshold value for sensor elements of a sensor element array, such as a spacing of less than approximately 10 μm, less than approximately 5 μm, less than approximately 1 μm, or the like. As shown in FIG. 3, example implementation 300 includes a substrate 310, a set of photodiodes 320, a first mirror layer 330, a set of spacer layers 340, a second mirror layer 350. Photodiodes 320 are associated with a spacing of separation width 360.

In some implementations, substrate 310 may be associated with a wafer width of between approximately 50 millimeters (mm) and 500 mm, such as an approximately 100 mm width, an approximately 150 mm width, an approximately 200 mm width, an approximately 300 mm width, an approximately 450 mm width, or the like. In some implementations, substrate 310 may be associated with a thickness of between approximately 50 μm and 1.0 mm. In some implementations, when substrate 310 is associated with a back-illuminated photodiode 320, substrate 310 may be associated with thickness of between approximately 5 μm and 70 μm, between approximately 25 μm and 50 μm, or the like, which may be, for example, temporarily bonded to a carrier wafer of another thickness.

In some implementations, photodiodes 320 may be associated with a width of between approximately 1 μm and 20 μm. In some implementations, a mirror, such as first mirror layer 330 or second mirror layer 350 may be associated with a thickness of between approximately 20 nanometers (nm) and 80 nm. In some implementations, spacer layers 340 may be associated with a thickness of between approximately 15 nm and 300 nm.

With regard to FIG. 3, first mirror layer 330 and second mirror layer 350 sandwich a set of spacer layers 340. Spacer layers 340 may be deposited using a physical vapor deposition procedure, a chemical vapor deposition procedure, or the like to vary thicknesses of the set of spacer layers 340 and channels formed thereby. Based on varying thicknesses of the set of spacer layers 340, each photodiode 320, or another type of sensor element, is exposed to corresponding varying center wavelengths of light. In this way, an optical filter coating may be manufactured that permits separation width 360 to be less than a threshold value, such as less than 10 μm, less than 5 μm, less than 1 μm, less than 500 nm, or the like. In some implementations, separation width 360 may be between approximately 0.5 μm and 10 μm. In some implementations, separation width 360 may be approximately 150 nm.

As indicated above, FIG. 3 is provided merely as an example. Other examples are possible and may differ from what was described with regard to FIG. 3.

Figure 4A:
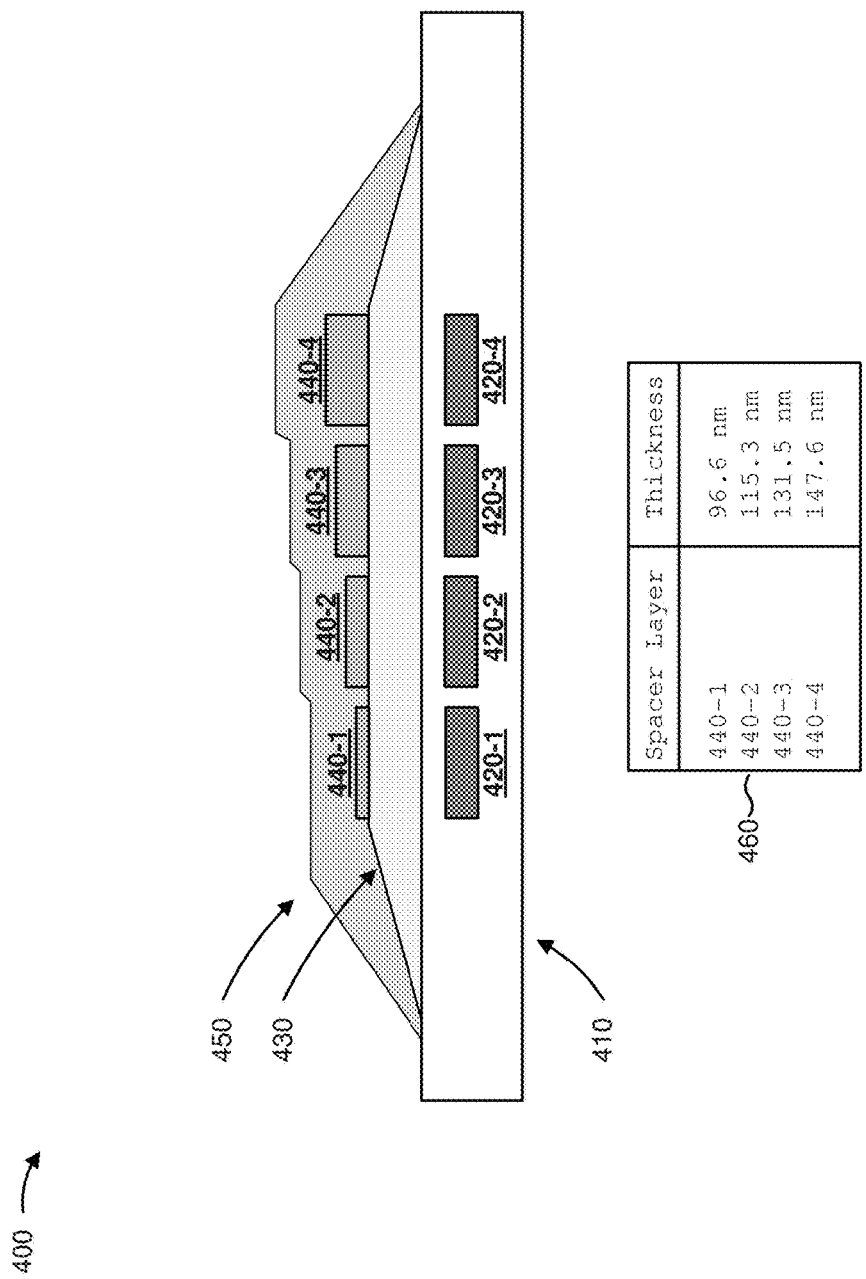

FIGS. 4A-4E are diagrams of example implementations 400/400'/400" of a single cavity Fabry-Perot filter based optical filter coating, as described herein. As shown in FIG. 4A, example implementation 400 includes a substrate 410, a set of photodiodes 420-1 to 420-4, a first mirror layer 430, a set of spacer layers 440-1 to 440-4, and a second mirror layer 450.

With regard to FIG. 4A, first mirror layer 430 and second mirror layer 450 may be quarterwave stacks using layers of silicon dioxide ($SiO_2$) and hydrogenated silicon (Si:H or Si_H). In another example, the quarterwave stacks may utilize another set of materials, such as another high refractive index material (e.g., niobium pentoxide ($Nb_2O_5$), tantalum pentoxide ($Ta_2O_5$), titanium dioxide ($TiO_2$), hafnium dioxide ($HfO_2$), a combination thereof, or the like), another low refractive index material (e.g., magnesium fluoride ($MgF_2$) or the like), or the like. In some implementations, a non-fluoride based material may be preferred to reduce a difficulty of deposition. In some implementations, a material with associated with a relatively higher effective index may be preferred to reduce an angle-shift, to reduce a quantity of layers of a blocker or mirror, or the like. Spacer layers 440 may be spacers manufactured using one or more layers of hydrogenated silicon. In another example, spacer layers 440 may include another material, such as $Nb_2O_5$, $Ta_2O_5$, $TiO_2$, $HfO_2$, another type of oxide, a combination thereof, or the like. First mirror layer 430 and/or second mirror layer 450 may be disposed in alignment with sensor elements, such as photodiodes 420.

In another example, semi-transparent metal mirrors may be used rather than quarterwave stacks, as described herein. For example, a metal mirror including a silver (Ag) layer may be used for an ultraviolet (UV)-A spectral range, a visible spectral range, a near infrared spectral range (NIR), or the like. Similarly, a metal mirror including an aluminum (Al) layer may be used for a UV spectral range or the like (approximately 200 nm to 400 nm range).

In some implementations, first mirror layer 430 may include a blocker layer disposed on a surface of first mirror layer 430, a protective layer disposed on a surface of first mirror layer 430, or the like. Each spacer layer 440 is associated with a particular thickness that corresponds to a particular center wavelength of light being passed to a corresponding photodiode 420 or another type of sensor element. For example, as shown in table 460, spacer layer 440-1 may be associated with a thickness of approximately 96.6 nm, spacer layer 440-2 may be associated with a thickness of approximately 115.3 nm, spacer layer 440-3 may be associated with a thickness of approximately 131.5 nm, and spacer layer 440-4 may be associated with a thickness of approximately 147.6 nm. In this case, each spacer layer 440 may be deposited onto first mirror layer 430 using a set of patterning and coating steps for each spacer layer 440. As shown, second mirror layer 450 may be deposited onto exposed portions of first mirror layer 430 and spacer layers 440, thereby encapsulating spacer layers 440 with first mirror layer 430. In this way, a spacing between photodiodes 220 or other sensor elements of between approximately 600 nm and 10 μm, less than approximately 600 nm, or the like may be achieved.

In some implementations, spacer layers 440 may be deposited using a physical vapor deposition (PVD) procedure. For example, spacer layers 440 and/or other portions of implementations described herein may be manufactured using a magnetron sputtering procedure, an e-beam and thermal evaporation procedure, and/or the like. In some implementations, spacer layers 440 may be deposited using a chemical vapor deposition (CVD) procedure. In some implementations, a thickness of spacer layers 440 may be selected to achieve a particular spectral range of light, such as a UV spectral range (e.g., approximately 200 nm to 400 nm), a visible spectral range (e.g., approximately 400 nm to 700 nm), an NIR spectral range (e.g., approximately 700 nm to 2000 nm), a mid-wavelength IR (MWIR) spectral range (e.g., approximately 2 μm to 6 μm), a low-wavelength IR (LWIR) spectral range (e.g., approximately 6 μm to 14 μm), or the like. The thicknesses of layers may be related to a desired spectral range. For example, for a spectral range of approximately 2 μm to 6 μm or approximately 6 μm to 14 μm, thicknesses of mirror layers 430 or 450 may be between approximately 20 nm and 400 nn, spacer layers 440 may be between approximately 15 nm and 1500 nm, or the like. In some implementations, spacer layers 440 may be deposited to manufacture a silicon-based detector, an indium gallium arsenide (InGaAs)-based detector, or the like. In some implementations, spacer layers 440 may be deposited for a hyperspectral imaging sensor. In some implementations, spacer layers 440 may be deposited for a back-illuminated sensor or a front-illuminated sensor.

Figure 4B:
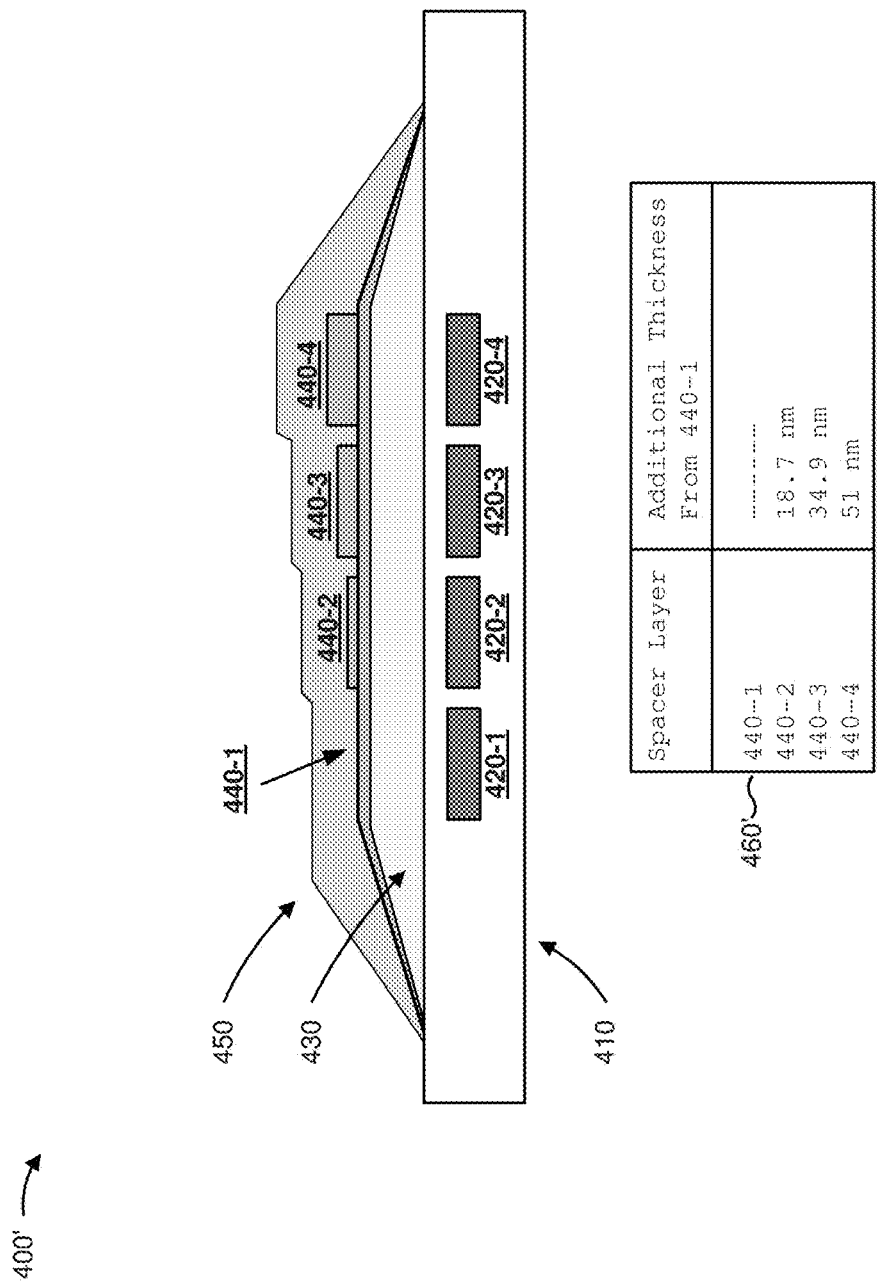

As shown in FIG. 4B, a similar example implementation 400' includes a substrate 410, a set of photodiodes 420-1 to 420-4, a first mirror layer 430, a set of spacer layers 440-1 to 440-4, and a second mirror layer 450.

With regard to FIG. 4B, spacer layer 440-1 is deposited to cover all of first mirror layer 430 and each photodiode 420, and each other spacer layer 440 is deposited onto spacer layer 440-1. In this way, example implementation 400' is associated with a reduced quantity of patterning and coating steps that are to be performed to deposit spacer layers 440 relative to the patterning and coating steps that are performed to deposit spacer layers 440 of example implementation 400. In some implementations, when a mirror layer, such as mirror layer 430, is a metal mirror layer (e.g., a silver based material), a spacer layer, such as spacer layer 440-1, may provide a protective coating of the metal mirror layer. In another example, each of spacer layers 440-2 to 440-4 may be patterned and coated onto first mirror layer 430, and spacer layer 440-1 may be deposited onto exposed portions of first mirror layer 430 and each of spacer layers 440-2 to 440-4 before depositing second mirror layer 450. In other words, an entire surface of first spacer layer 440-1 is disposed contiguous to the surface of second mirror layer 450 rather than contiguous to first mirror layer 430. As shown in table 460', each of spacer layers 440-2 to 440-4 is associated with a particular thickness in addition to the thickness of spacer layer 440-1 (e.g., approximately 96.6 nm). For example, spacer layer 440-2 is associated with an additional thickness of approximately 18.7 nm, spacer layer 440-3 is associated with an additional thickness of approximately 34.9 nm, and spacer layer 440-4 is associated with an additional thickness of approximately 51 nm.

Figure 4C:
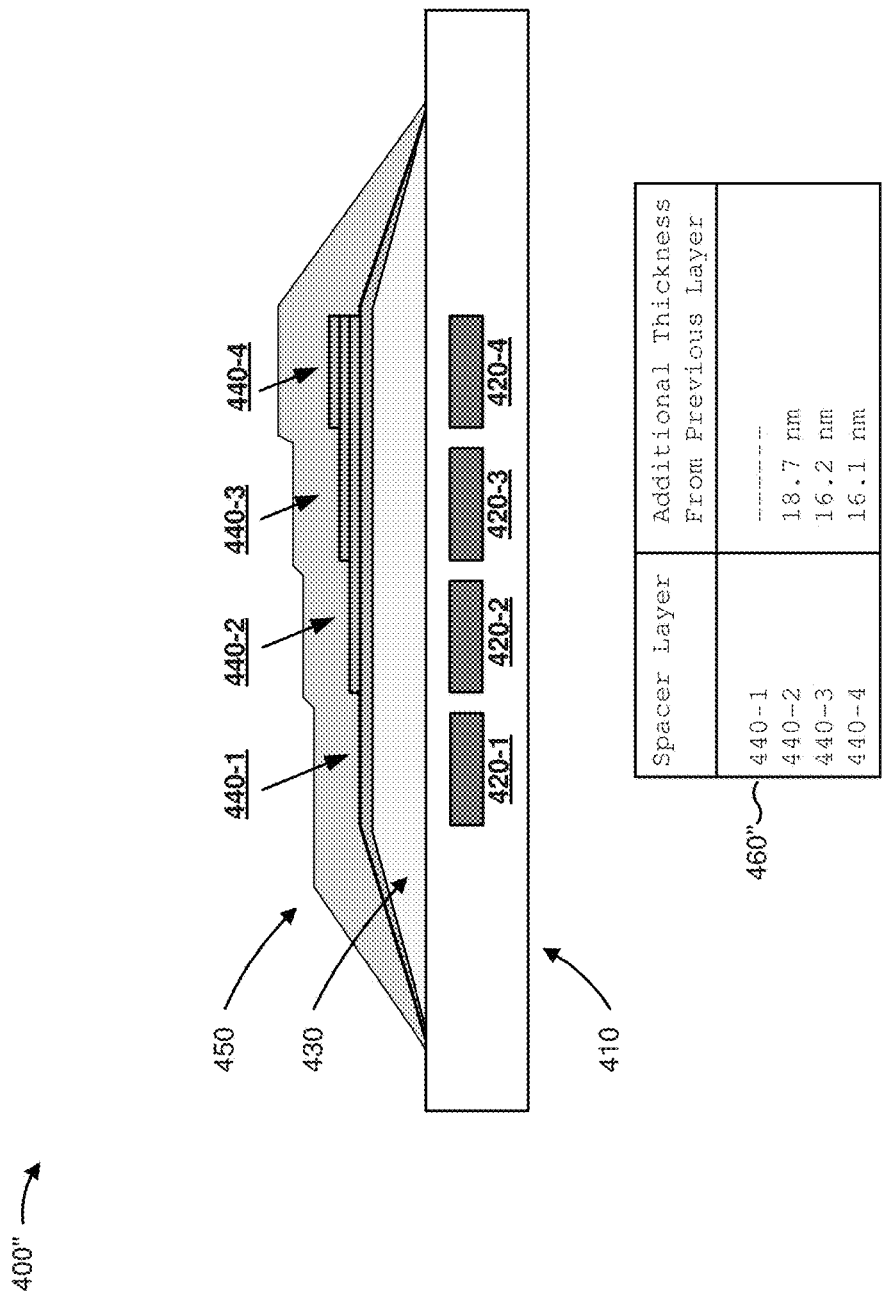

As shown in FIG. 4C, a similar example implementation 400" includes a substrate 410, a set of photodiodes 420-1 to 420-4, a first mirror layer 430, a set of spacer layers 440-1 to 440-4, and a second mirror layer 450.

With regard to FIG. 4C, spacer layer 440-1 is deposited onto first mirror layer 430 and covers each of photodiodes 420-1 to 420-4. Similarly, spacer layer 440-2 is deposited onto a portion of spacer layer 440-1 and covers each of photodiodes 420-2 to 420-4. Similarly, spacer layer 440-3 is deposited onto a portion of spacer layer 440-2 and covers a subset of photodiodes 420 (e.g., each of photodiodes 420-3 to 420-4). Similarly, spacer layer 440-4 is deposited onto a portion of spacer layer 440-3 and covers photodiode 420-4. In this way, example implementation 400" reduces a quantity of patterning and coating steps that are to be performed to deposit spacer layers 440 in example implementation 400. As shown in table 460", each of spacer layers 440-2 to 440-4 is associated with a thickness in addition to the thickness of a previous spacer layer 440. For example, spacer layer 440-2 is associated with an additional thickness of approximately 18.7 nm deposited onto spacer layer 440-1 (e.g., which is associated with a thickness of approximately 96.6 nm), spacer layer 440-3 is associated with an additional thickness of approximately 16.2 nm deposited onto spacer layer 440-2, and spacer layer 440-4 is associated with an additional thickness of approximately 16.1 nm deposited onto spacer layer 440-3. In this way, a spacing between photodiodes 220 or other sensor elements of between approximately 150 nm and 2 μm, less than approximately 150 nm, or the like may be achieved.

As shown in FIG. 4D, a chart 470 identifies a set of optical characteristics relating to channels of example implementations 400/400'/400". For example, for a first channel associated with spacer layer 440-1 and photodiode 420-1, a thickness of spacer layer 440-1 results in a center wavelength of approximately 795 nm. Similarly, for a second channel associated with spacer layer 440-2 and photodiode 420-2, a thickness of spacer layer 440-2 results in a center wavelength of approximately 870 nm. Similarly, for a third channel associated with spacer layer 440-3 and photodiode 420-3, a thickness of spacer layer 440-3 results in a center wavelength of approximately 935 nm. Similarly, for a fourth channel associated with spacer layer 440-4 and photodiode 420-4, a thickness of spacer layer 440-4 results in a center wavelength of approximately 1000 nm. Although described herein in terms of a particular set of center wavelengths, other center wavelengths are possible and may differ from what was described with regard to FIG. 4D.

As shown in FIG. 4E, a chart 480 identifies a set of physical characteristics relating example implementations 400/400'/400". For example, a mirror, such as mirror layer 430 or mirror layer 450, may be associated with a thickness of between approximately 40 nm and 500 nm. Similarly, a spacer layer, such as spacer layer 440-4 may be associated with a thickness of approximately 147.61 nm. In some implementations, mirror layers, such as mirror layer 430 or mirror layer 450 may be associated with multiple layers. For example, mirror layers may include Si:H layers, SiO2 layers, etc.

As indicated above, FIGS. 4A-4E are provided merely as examples. Other examples are possible and may differ from what was described with regard to FIGS. 4A-4E.

Figure 5A:
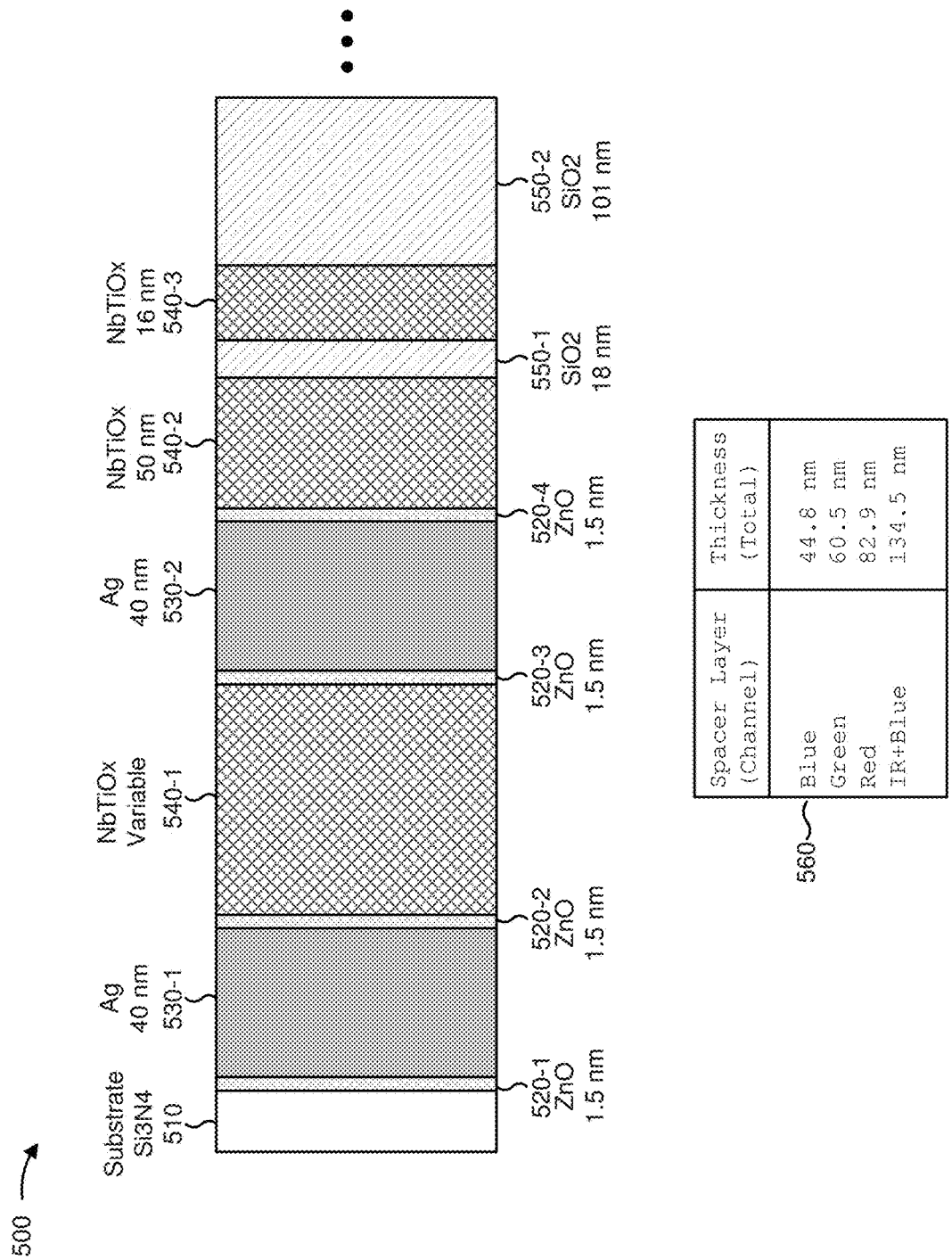

FIGS. 5A-5E are diagrams of an example implementation 500 of an optical filter coating for a depth sensing system, as described herein. As shown in FIG. 5A, example implementation 500 includes a substrate 510 (e.g., silicon nitride (S3N4) or in another example SiO2 or Si), a set of zinc oxide (ZnO) layers 520-1 to 520-4, a set of silver (Ag) layers 530-1 to 530-2, a set of niobium titanium oxide (NbTiOx) layers 540-1 to 540-3, and a set of silicon dioxide (SiO2) layers 550-1 to 550-2. In some implementations, the optical filter coating of example implementation 500 may be a Fabry-Perot optical filter. In some implementations, another example may include a transparent substrate 510 that is bonded to a sensor device.

With regard to FIG. 5A, ZnO layers 520 may be each associated with a thickness of approximately 1.5 nm. Ag layers 530, which are a set of semi-transparent metal mirrors encapsulating a set of spacer layers formed by NbTiOx 540-1, are associated with a thickness of approximately 40 nm. NbTiOx 540-1 may correspond to the spacers 440 in FIGS. 4A-4C, resulting in differing thicknesses for NbTiOx 540-1 corresponding to a spacer thickness that is desired. As shown by table 560, NbTiOx 540-1 may form a set of three channels for visible light (e.g., red/green/blue (RGB) light) detection for image sensing and a fourth channel (e.g., IR and blue light) for depth sensing (e.g., three-dimensional depth sensing). Collectively, the four channels may correspond to spacers 440-1 through 440-4 shown in FIGS. 4A-4C. A first channel for blue visible light detection may be associated with a total thickness of approximately 44.8 nm, a second channel for green visible light detection may be associated with a total thickness of approximately 60.5 nm, a third channel for red visible light detection may be associated with a total thickness of approximately 82.9 nm, and the fourth channel for IR and blue light detection (i.e., depth sensing) may be associated with a total thickness of approximately 134.5 nm. In some implementations, layers of NbTiOx 540-1 may be deposited in a form as shown in FIGS. 4A-4C. For example, each channel may be a separate filter layer stack, each channel may share a common first filter layer, each channel may be deposited on a portion of a previously deposited filter layer, or the like. In this case, depositing at least one layer common to each channel, as in FIGS. 4B and 4C, may improve durability of Ag layers 530 by providing a protective layer.

With further regard to FIG. 5A, NbTiOx layer 540-2 may be associated with a thickness of approximately 50 nm, SiO2 layer 550-1 may be associated with a thickness of approximately 18 nm, NbTiOx layer 540-3 may be associated with a thickness of approximately 16 nm, and SiO2 layer 550-2 may be associated with a thickness of approximately 101 nm. Layers 540-2, 550-1, 540-3, and 550-2 may collectively form an anti-reflection coating for sensor elements embedded in substrate 510 or disposed onto substrate 510.

Figure 5B:
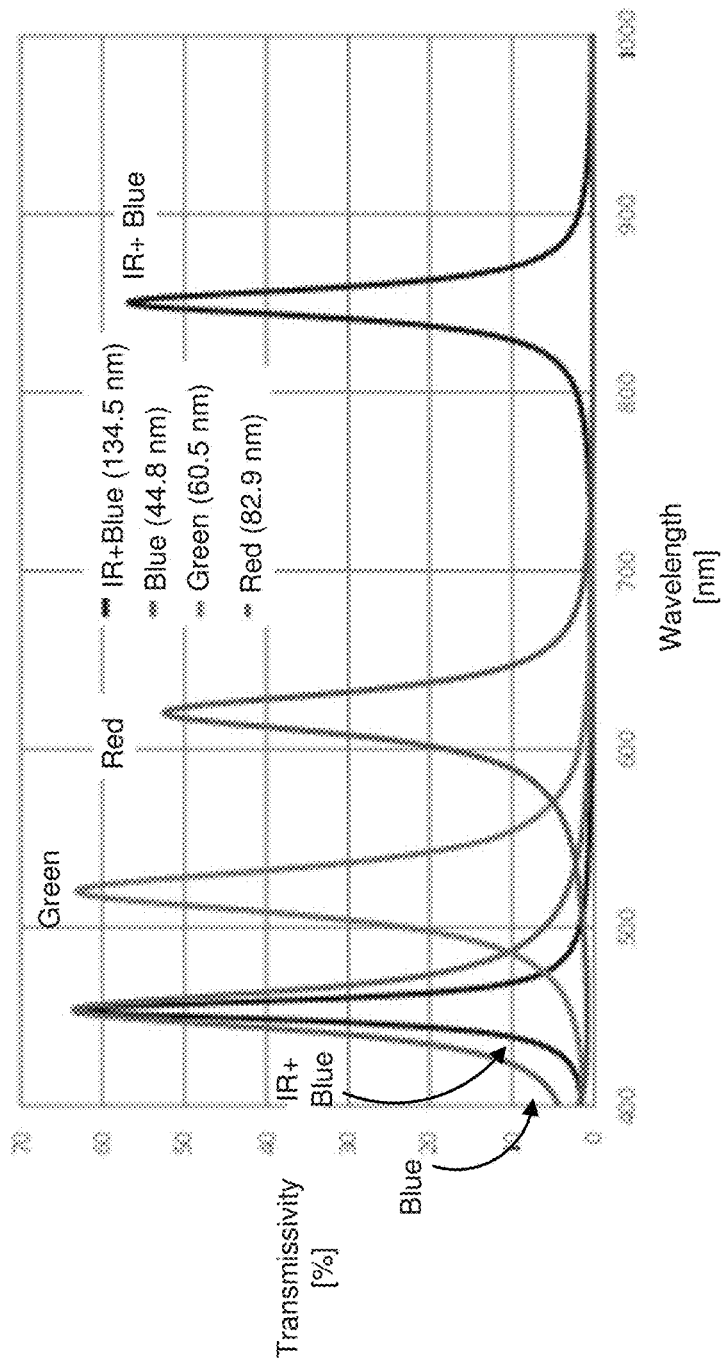

As shown in FIG. 5B, a chart 570 identifies a set of optical characteristics relating to channels of example implementation 500. For example, the first channel associated with red visible light sensing is associated with a center wavelength of approximately 620 nm. Similarly, the second channel associated with green visible light sensing is associated with a center wavelength of approximately 520 nm. Similarly, the third channel associated with blue visible light sensing is associated with a center wavelength of approximately 450 nm. Similarly, the fourth channel associated with depth sensing (e.g., blue light and IR lights sensing) is associated with center wavelengths of approximately 450 nm (blue light) and 850 nm (IR light). Although described herein in terms of a particular set of center wavelengths, other center wavelengths are possible and may differ from what was described with regard to FIG. 5B.

As shown in FIG. 5C, a diagram 580 identifies a sensor element array of sensor elements relating to example implementation 500. For example, the sensor element array (e.g., a complimentary metal-oxide-semiconductor (CMOS) technology, a charge-coupled device (CCD) technology, or the like) includes a set of first channels (e.g., red light channels, identified as R), a second of second channels (e.g., green light channels, identified as G), a set of third channels (e.g., blue light channels, identified as B), and a set of fourth channels (e.g., IR and blue light channels, identified as IR/B). In this case, spacer layers for the sensor element array are manufactured by depositing each spacer layer on a portion of the previous spacer layer, as described herein with regard to FIG. 4C. This results in the IR/B channels having the greatest thickness, relative to other channels, of approximately 51.6 nm. Based on that thickness, spacing of sensor elements of the sensor element array may be approximately 150 nm.

In some implementations, the sensor elements may be back illuminated sensor elements to provide an improved quantum efficiency and spectral response reproducibility relative to another configuration of sensor elements. In some implementations, a dielectric blocker may be applied to the IR/B channels with a thickness of approximately 750 nm, resulting in a spacing of approximately 2 μm. Although described herein in terms of a particular pattern for arranging four spectral ranges of channels, other patterns and/or other quantities of channels may be possible. For example, although diagram 580 depicts a sensor element array with 64 channels, implementations, described herein, may be used with another quantity of channels less than a threshold, such as less than or equal to 64 channels (e.g., 64 channels, 63 channels, 62 channels, . . . , 2 channels, etc.), less than or equal to 32 channels, less than or equal to 16 channels, less than or equal to 8 channels, less than or equal to 4 channels, or the like. In another example, another quantity of sensor elements (i.e., pixels) may be included. For example, implementations described herein may be utilized for a pixel count of between approximately 10 million pixels and 40 million pixels, between approximately 250 thousand pixels and 40 million pixels, or the like. Additionally, or alternatively, implementations described herein may be utilized for a pixel count greater than approximately 250 thousand, a pixel count greater than approximately 1 million, a pixel count greater than approximately 4 million, a pixel count greater than approximately 20 million, or the like.

Figure 5D:
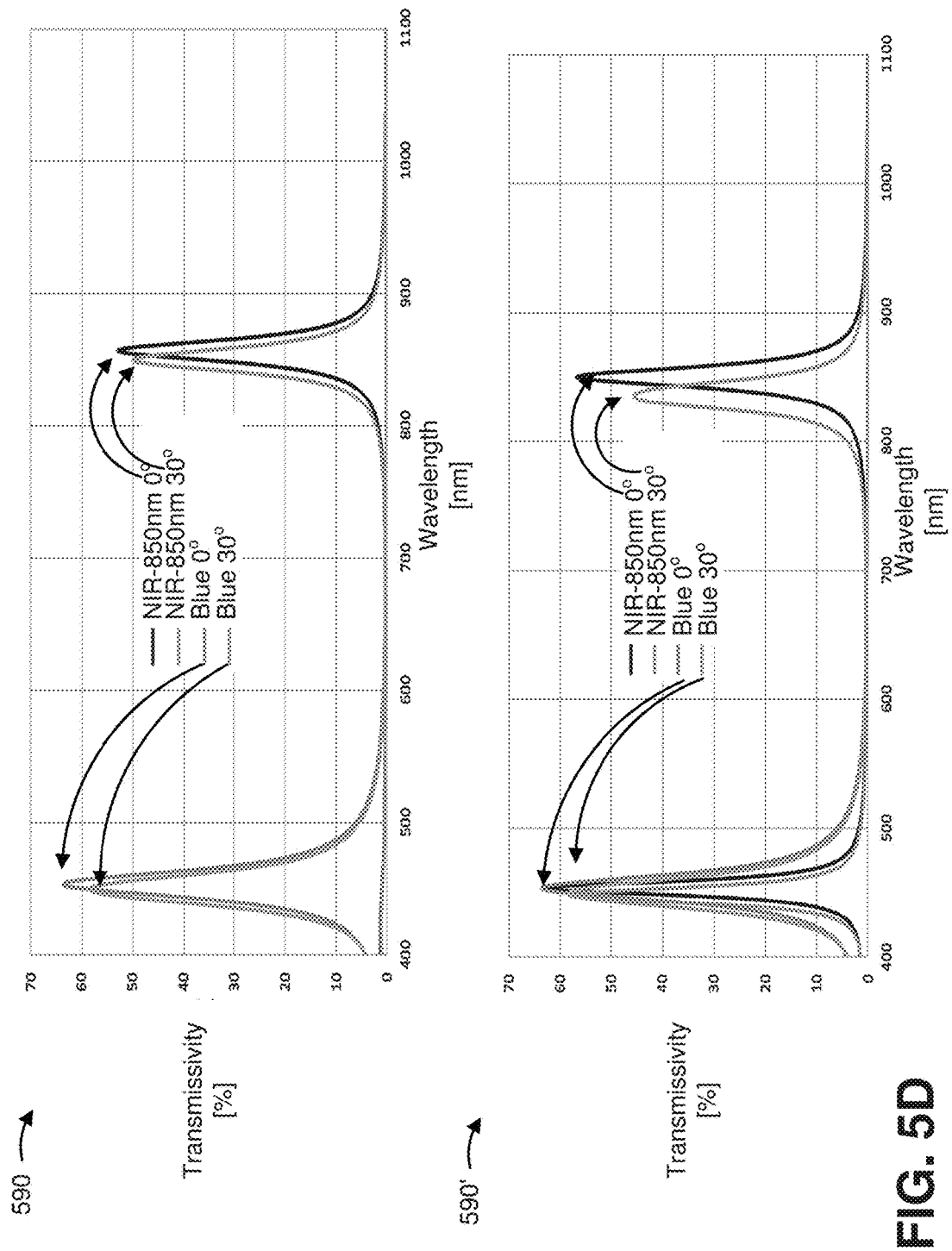
Figure 5E:
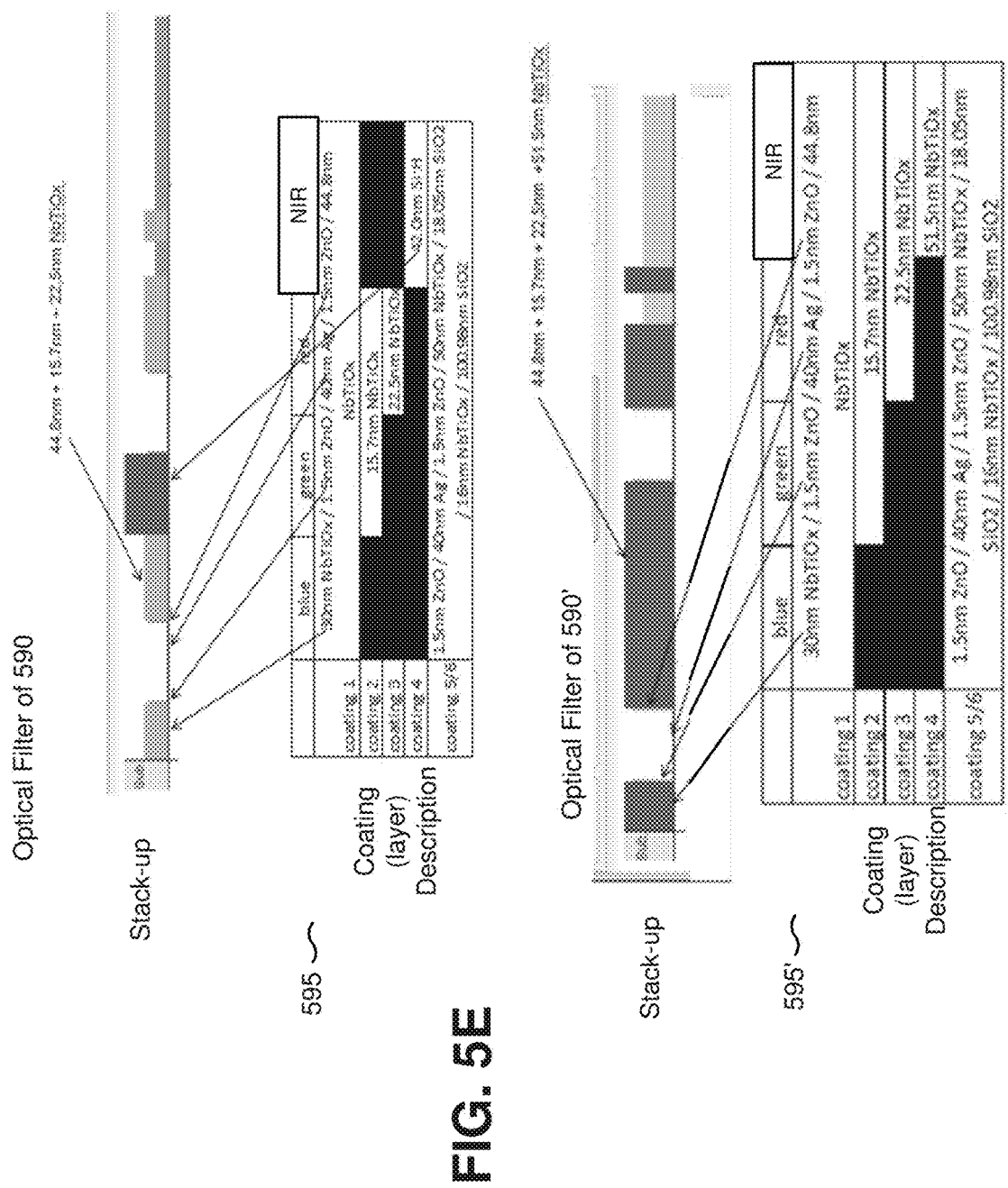

With regard to FIG. 5D, a diagram 590 and a diagram 590' are provided to identify example optical characteristics relating to an angle shift of sensor elements. Diagrams 590 and 590' show an angle shift of sensor elements. For example, diagram 590 may be associated with using a mixed spacer configuration for a near-infrared filter (e.g., an approximately 44.8 nm niobium-titanium-oxide (NbTiOx) and an approximately 42 nm Si:H spacer). In another example, the mixed spacer configuration may include another first material (e.g., another oxide) for one or more first layers and another second material for one or more second layers. Diagram 590 may be associated with an optical filter utilizing a set of coatings described in FIG. 5E and by diagram 595. Diagram 590' may be associated with using a spacer configuration similar to example implementation 500. Diagram 590' may be associated with an optical filter utilizing a set of coatings described in FIG. 5E and by diagram 595'. As shown in FIG. 5E, the optical filter of diagram 590 and the optical filter of diagram 590' are associated with similar stackups for a red channel, a green channel, and a blue channel, but are associated with different stackups for an NIR channel. For example, the optical filter of diagram 590 is associated with a hydrogenated-silicon layer that blocks a second order peak, as described herein.

As shown in FIG. 5D, at a shift from a 0 degree angle of incidence (AOI) to a 30 degree AOI in the NIR (e.g., approximately 850 nm) spectrum, sensor elements associated with the optical filter of diagram 590 receiving NIR light exhibit a reduced angle shift and an improved transmissivity relative to sensor elements associated with the optical filter of diagram 590'. Similarly, at a shift from a 0 degree AOI to a 30 degree AOI in the blue light spectral range (e.g., approximately 450 nm), angle shift is reduced and transmissivity is improved for sensor elements utilizing the optical filter of diagram 590 relative to sensor elements using the optical filter of diagram 590'. Moreover, as shown, a blocker is not needed to suppress a second order peak for sensor elements utilizing the optical filter of diagram 590.

As indicated above, FIGS. 5A-5E are provided merely as examples. Other examples are possible and may differ from what was described with regard to FIGS. 5A-5E.

In this way, an optical filter may be manufactured for a sensor element array with a spacing of less than approximately 10 μm, 5 μm, 1 μm, 500 nm, 200 nm, 150 nm, or the like. Moreover, the optical filter may be associated with a reduced angle shift and an improved transmissivity relative to another type optical filter.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
    a first mirror disposed on a substrate;
    a plurality of spacers disposed on the first mirror,
        a first spacer, of the plurality of spacers, being associated with a first thickness,
        a second spacer, of the plurality of spacers, being associated with a second thickness that is different from the first thickness;
    a first sensor element corresponding to the first spacer; and
    a second sensor element corresponding to the second spacer,
        a separation width between the first sensor element and the second sensor element being less than approximately 10 micrometers (μm); and
    a second mirror disposed on the plurality of spacers,
        the second mirror including a first slanted side and a second slanted side, and
        the second slanted side being on an opposite side of the second mirror from the first slanted side.

2. The device of claim 1, wherein the second mirror is aligned with the first sensor element, the second sensor element, and a third sensor element.

3. The device of claim 1, wherein the plurality of spacers are deposited onto the substrate using at least one of:
    a physical vapor deposition (PVD) process,
    a chemical vapor deposition (CVD) process, or
    a lift-off process.

4. The device of claim 1,
    wherein the first thickness or the second thickness is selected to pass through a particular spectral range of light, and wherein the particular spectral range of light includes at least one of:
an ultraviolet (UV) spectral range,
a visible spectral range,
a near infrared (NIR) spectral range,
a mid-wavelength infrared (MWIR) spectral range, or
a low-wavelength infrared (LWIR) spectral range.

5. The device of claim 1, wherein the device is a silicon-based detector or an indium gallium arsenide (InGaAS)-based detector.

6. The device of claim 1, wherein the device is a hyperspectral imaging sensor with less than a threshold quantity of channels.

7. The device of claim 1, wherein the first mirror or the second mirror is a metal mirror including a silver layer or an aluminum layer.

8. The device of claim 1, wherein the first mirror or the second mirror is a quarterwave stack including a low refractive index material and a high refractive index material,
the low refractive index material including at least one of:
a magnesium fluoride (MgF2) layer, or
a silicon oxide (SiO2) layer.

9. The device of claim 1, wherein the first mirror or the second mirror is a quarterwave stack including a low refractive index material and a high refractive index material,
the high refractive index material including at least one of:
a hydrogenated silicon (Si:H) layer,
a niobium pentoxide (Nb2O5) layer,
a tantalum pentoxide (Ta2O5) layer,
a titanium dioxide (TiO2) layer, or
a hafnium dioxide (HfO2) layer.

10. The device of claim 1, wherein the plurality of spacers include at least one of:
a hydrogenated silicon (Si:H) layer,
a niobium pentoxide (Nb2O5) layer,
a tantalum pentoxide (Ta2O5) layer,
a titanium dioxide (TiO2) layer, or
a hafnium oxide (HfO2) layer.

11. A device, comprising:
a mirror;
a first spacer disposed on the mirror;
a second spacer disposed on the mirror;
a first sensor element corresponding to the first spacer;
a second sensor element corresponding to the second spacer;
a separation width between the first sensor element and the second sensor element being less than approximately 10 micrometers (μm); and
a different mirror disposed on the first spacer and the second spacer,
the different mirror including a first slanted side and a second slanted side, and
the second slanted side being on an opposite side of the different mirror from the first slanted side.

12. The device of claim 11, wherein the different mirror is aligned with the first sensor element and the second sensor element.

13. The device of claim 11, wherein the mirror or the different mirror is a metal mirror including a silver layer or an aluminum layer.

14. The device of claim 11,
wherein the mirror or the different mirror is a quarterwave stack including a low refractive index material and a high refractive index material, and
wherein the low refractive index material includes at least one of:
a magnesium fluoride (MgF2) layer, or
a silicon oxide (SiO2) layer.

15. The device of claim 11,
wherein the mirror or the different mirror is a quarterwave stack including a low refractive index material and a high refractive index material, and
wherein the high refractive index material includes at least one of:
a hydrogenated silicon (Si:H) layer,
a niobium pentoxide (Nb2O5) layer,
a tantalum pentoxide (Ta2O5) layer,
a titanium dioxide (TiO2) layer, or
a hafnium dioxide (HfO2) layer.

16. The device of claim 11,
wherein the first spacer includes a first thickness,
wherein the second spacer includes a second thickness,
wherein the first thickness or the second thickness is selected to pass through a particular spectral range of light, and
wherein the particular spectral range of light includes at least one of:
an ultraviolet (UV) spectral range,
a visible spectral range,
a near infrared (NIR) spectral range,
a mid-wavelength infrared (MWIR) spectral range, or
a low-wavelength infrared (LWIR) spectral range.

17. The device of claim 11, wherein the device is a silicon-based detector or an indium gallium arsenide (In-GaAS)-based detector.

18. The device of claim 11, further comprising at least one of:
a blocker layer disposed on the mirror; or
a protective layer disposed on the mirror.

19. The device of claim 11, wherein the first spacer and the second spacer include at least one of:
a hydrogenated silicon (Si:H) layer,
a niobium pentoxide (Nb2O5) layer,
a tantalum pentoxide (Ta2O5) layer,
a titanium dioxide (TiO2) layer, or
a hafnium oxide (HfO2) layer.

20. The device of claim 11,
wherein the mirror is disposed on a substrate, and
wherein a set of photodiodes are positioned in the substrate.

* * * * *